United States Patent
Ai et al.

(10) Patent No.: US 10,976,586 B2
(45) Date of Patent: Apr. 13, 2021

(54) MANUFACTURING METHOD FOR LIQUID CRYSTAL DISPLAY PANEL WITH HIGH TRANSMITTANCE AND DISPLAY PANEL THEREOF

(71) Applicant: WUHAN CHINA STAR OPTOELECTRONICS TECHNOLOGY CO., LTD., Wuhan (CN)

(72) Inventors: Fei Ai, Wuhan (CN); Peng Lu, Wuhan (CN); Chengzhi Luo, Wuhan (CN)

(*) Notice: Subject to any disclaimer, the term of this patent is extended or adjusted under 35 U.S.C. 154(b) by 176 days.

(21) Appl. No.: 16/475,379

(22) PCT Filed: Mar. 14, 2019

(86) PCT No.: PCT/CN2019/078065
§ 371 (c)(1),
(2) Date: Jul. 2, 2019

(87) PCT Pub. No.: WO2020/133718
PCT Pub. Date: Jul. 2, 2020

(65) Prior Publication Data
US 2020/0249519 A1  Aug. 6, 2020

(30) Foreign Application Priority Data

Dec. 29, 2018 (CN) .......................... 201811640748.2

(51) Int. Cl.
| | | |
|---|---|---|
| *G02F 1/1335* | (2006.01) | |
| *G02F 1/1333* | (2006.01) | |
| *G02F 1/1368* | (2006.01) | |
| *H01L 27/12* | (2006.01) | |
| *H01L 21/02* | (2006.01) | |

(52) U.S. Cl.
CPC ...... *G02F 1/133502* (2013.01); *G02F 1/1368* (2013.01); *G02F 1/133345* (2013.01);
(Continued)

(58) Field of Classification Search
CPC ......... G02F 1/133502; G02F 1/133345; G02F 1/1368; H01L 27/1262; H01L 21/02164;
(Continued)

(56) References Cited

U.S. PATENT DOCUMENTS

| | | | |
|---|---|---|---|
| 2002/0146570 A1 | 10/2002 | Choi et al. | |
| 2010/0208350 A1* | 8/2010 | Yoshihara | G02B 1/116 359/585 |

(Continued)

FOREIGN PATENT DOCUMENTS

| | | |
|---|---|---|
| CN | 103887441 A | 6/2014 |
| CN | 103928634 A | 7/2014 |

(Continued)

*Primary Examiner* — Feifei Yeung Lopez

(57) ABSTRACT

A manufacturing method for a liquid crystal display panel is disclosed and includes a step forming a refractive index gradient layer, a step forming a gate electrode insulation layer, a step forming a first interlayer dielectric layer, and a step forming a second interlayer dielectric layer. The step forming a refractive index gradient layer includes depositing a silicon nitride layer on a glass substrate, depositing the refractive index gradient layer on the silicon nitride layer. The refractive index gradient layer is silicon oxide, and includes a lower refractive index decremental layer and a lower refractive index constant layer. A refractive index of the decremental layer gradually decreases along a direction away from the silicon nitride layer, the lower refractive index constant layer is on the lower refractive index decremental layer. A reflection rate between light in film layers can be lowered to improve light transmittance of the display panel.

15 Claims, 3 Drawing Sheets

(52) U.S. Cl.
CPC ...... *H01L 27/1248* (2013.01); *H01L 27/1262* (2013.01); *H01L 21/0217* (2013.01); *H01L 21/02164* (2013.01); *H01L 21/02211* (2013.01); *H01L 21/02274* (2013.01)

(58) Field of Classification Search
CPC ........... H01L 21/0217; H01L 21/02211; H01L 21/02274
See application file for complete search history.

(56) References Cited

U.S. PATENT DOCUMENTS

| | | |
|---|---|---|
| 2014/0168778 A1 | 6/2014 | Chen et al. |
| 2016/0007438 A1 | 1/2016 | Hsu et al. |
| 2017/0012064 A1 | 1/2017 | Choi et al. |
| 2019/0103588 A1 | 4/2019 | Jiang et al. |
| 2019/0229017 A1 | 7/2019 | Liu et al. |

FOREIGN PATENT DOCUMENTS

| | | |
|---|---|---|
| CN | 105224120 A | 1/2016 |
| CN | 105514119 A | 4/2016 |
| CN | 105895581 A | 8/2016 |
| CN | 107492576 A | 12/2017 |
| CN | 107516713 A | 12/2017 |
| CN | 107689345 A | 2/2018 |
| CN | 107810555 A | 3/2018 |
| CN | 207637514 U | 7/2018 |
| JP | 2002341111 A | 11/2002 |

\* cited by examiner

MANUFACTURING METHOD FOR LIQUID CRYSTAL DISPLAY PANEL WITH HIGH TRANSMITTANCE AND DISPLAY PANEL THEREOF

FIELD OF INVENTION

The present invention relates to a display panel manufacturing method, especially to a manufacturing method for a liquid crystal display panel with high transmittance and a high transmittant liquid crystal display panel that can lower a reflection rate of light between film layers to improve a light transmittance of the high transmittant liquid crystal display panel.

BACKGROUND OF INVENTION

In recent years, thin film transistor liquid crystal displays (TFT-LCDs) have been developed with power saving, high resolution, a high color rendering index, etc. Enhancing a transmittant ability to improve brightness of the TFT-LCD with lowered power consumption is a critical issue that display panel manufacturers are trying to overcome. Transmittance of the TFT-LCD display panel means a light intensity ratio after penetrating the TFT-LCD display panel and light before penetrating the TFT-LCD display panel. Under a general condition, the transmittance of the TFT-LCD display panel is only 3-10%. In other words, over 90% of the light cannot be utilized. For the TFT-LCD panel, besides metal wires, a multi-film layer structure made of silicon oxide (SiOx), silicon nitride (SiNx), indium tin oxide (ITO), and a planarization layer also greatly affects the transmittance. a refractive index and a thickness of each film layer affects total transmittance of a multi-film layer. Therefore, by adjusting parameters of each film layer such as a film characteristic, a thickness, and, a film layer structure, the transmittance of the multi-film layer can be improved.

When light penetrates through interfaces between the film layers, reflection and refraction occur on the interfaces. An equation for calculating a reflection rate on each interface is as follows: $R=(n_2-n_1)2/(n_2+n_1)^2$, wherein R, $n_1$, and $n_2$ are the reflection rate and refractive indexes of films respectively on two sides of the interface. According to the above equation, it is understood that the less a difference of the refractive indexes of the film layers on the interface is, the lower the reflection rate is and the higher the transmittance is. Under a general condition, because a difference of a refractive index (1.45) of the silicon oxide (SiOx) layer and a refractive index (1.92) of a silicon nitride (SiNx) layer is great, the reflection rate on the interface is high and causes a lowered transmittance.

Therefore, it is necessary to provide a manufacturing method for a liquid crystal display panel with high transmittance and high transmittant liquid crystal display panel to solve existing issues of the prior art.

SUMMARY OF INVENTION

Technical Issue

According to a shortage of a poor transmittance of a conventional liquid crystal display, the present invention provides a manufacturing method for a liquid crystal display panel with high transmittance and high transmittant liquid crystal display panel.

Technical Solution

A main objective of the present invention is to provide a manufacturing method for a liquid crystal display panel with high transmittance, comprising:

a step for forming a refractive index gradient layer, comprising depositing a silicon nitride layer on a glass substrate, and depositing a refractive index gradient layer on the silicon nitride layer, wherein the refractive index gradient layer is made of silicon oxide, and the refractive index gradient layer comprises a lower refractive index decremental layer and a lower refractive index constant layer, a refractive index of the lower refractive index decremental layer gradually decreases along a direction away from the silicon nitride layer, and the lower refractive index constant layer is deposited on the lower refractive index decremental layer;

a step for forming a gate electrode insulation layer, comprising depositing a gate electrode insulation layer on the refractive index gradient layer;

a step for forming a first interlayer dielectric layer, comprising depositing a first interlayer dielectric layer on the gate electrode insulation layer, wherein the first interlayer dielectric layer comprises a middle refractive index incremental layer, a middle refractive index constant layer, and a middle refractive index decremental layer, a refractive index of the middle refractive index incremental layer gradually increases along a direction away from the gate electrode insulation layer, the middle refractive index constant layer is formed on the middle refractive index incremental layer, and a refractive index of the middle refractive index constant layer is constant, and a refractive index of the middle refractive index decremental layer gradually decreases along a direction away from the middle refractive index constant layer; and a step for forming a second interlayer dielectric layer, comprising depositing a second interlayer dielectric layer on the first interlayer dielectric layer.

In an embodiment of the present invention, the second interlayer dielectric layer comprises an upper refractive index decremental layer and an upper refractive index constant layer, a refractive index of the upper refractive index decremental layer gradually decreases along a direction away from the first interlayer dielectric layer, the upper refractive index constant layer is formed on the upper refractive index decremental layer, and a refractive index of the upper refractive index constant layer is constant.

In an embodiment of the present invention, the silicon oxide of the refractive index gradient layer is made by a plasma-enhanced chemical vapor deposition process employing tetraethoxysilane (TEOS) and oxygen as reactants to perform a chemical reaction, the lower refractive index decremental layer is formed by continuously changing a ratio of the TEOS and the oxygen and a power of producing plasma in the plasma-enhanced chemical vapor deposition process to make film density of the silicon oxide from compactness to looseness gradually such that a high-to-low gradient region of the refractive index is formed by the lower refractive index decremental layer.

In an embodiment of the present invention, the gate electrode insulation layer is made of silicon oxide, the first interlayer dielectric layer is made of silicon nitride, and the second interlayer dielectric layer is made of silicon oxide.

In an embodiment of the present invention, the silicon nitride of the first interlayer dielectric layer is made by a plasma-enhanced chemical vapor deposition process employing ammonia and silane as reactants to perform a chemical reaction, the middle refractive index incremental layer is formed by continuously changing a ratio of the ammonia and the silane and a power of producing plasma in the plasma-enhanced chemical vapor deposition process to make film density of the silicon nitride from looseness to compactness gradually, such that a low-to-high gradient region of the refractive index is formed by the middle refractive index incremental layer, and the middle refractive index decremental layer is formed by continuously changing a ratio of the ammonia and the silane and a power of producing plasma in the plasma-enhanced chemical vapor deposition process to make film density of the silicon nitride from compactness to looseness gradually such that a high-to-low gradient region of the refractive index is formed by the middle refractive index decremental layer.

In an embodiment of the present invention, the upper refractive index decremental layer of the second interlayer dielectric layer is formed by continuously changing a ratio of the TEOS and the oxygen and a power of producing plasma in the plasma-enhanced chemical vapor deposition process to make film density of the silicon oxide from compactness to looseness gradually such that a high-to-low gradient region of the refractive index is formed by the upper refractive index decremental layer.

In an embodiment of the present invention, the manufacturing method further comprises: a step for forming a planarization layer, comprising forming a planarization layer on the second interlayer dielectric layer; a step for forming a transparent electrode layer, comprising forming a transparent electrode layer on the planarization layer; and a step for forming a passivation layer, comprising forming a passivation layer on the transparent electrode layer.

In an embodiment of the present invention, the transparent electrode layer is made of indium tin oxide, and the passivation layer is made of silicon nitride.

Another objective of the present invention is to provide a high transmittant liquid crystal display panel, comprising:

a glass substrate;

a silicon nitride layer, formed on the glass substrate;

a refractive index gradient layer, formed on the silicon nitride layer, and comprising a lower refractive index decremental layer and a lower refractive index constant layer, wherein the lower refractive index decremental layer is formed on the silicon nitride layer, the refractive index of the lower refractive index decremental layer gradually decreases along a direction away from the silicon nitride layer, and the lower refractive index constant layer is formed on the lower refractive index decremental layer;

a gate electrode insulation layer, formed on the refractive index gradient layer;

a first interlayer dielectric layer, formed on the gate electrode insulation layer, and comprising a middle refractive index incremental layer, a middle refractive index constant layer and a middle refractive index decremental layer, a refractive index of the middle refractive index incremental layer gradually increases along a direction away from the gate electrode insulation layer, the middle refractive index constant layer is formed on the middle refractive index incremental layer, and a refractive index of the middle refractive index constant layer is constant, a refractive index of the middle refractive index decremental layer gradually decreases along a direction away from the middle refractive index constant layer; and a second interlayer dielectric layer, formed on the first interlayer dielectric layer, and comprising an upper refractive index decremental layer and an upper refractive index constant layer, wherein a refractive index of the upper refractive index decremental layer gradually decreases along a direction away from the first interlayer dielectric layer, the upper refractive index constant layer is formed on the upper refractive index decremental layer, and a refractive index of the upper refractive index constant layer is constant.

In an embodiment of the present invention, the gate electrode insulation layer is a silicon oxide layer.

Still another objective of the present invention is to provide a manufacturing method for a liquid crystal display panel with high transmittance, comprising:

a step for forming a refractive index gradient layer, comprising depositing a silicon nitride layer on a glass substrate, and depositing a refractive index gradient layer on the silicon nitride layer, wherein the refractive index gradient layer is made of silicon oxide, and the refractive index gradient layer comprises a lower refractive index decremental layer and a lower refractive index constant layer, a refractive index of the lower refractive index decremental layer gradually decreases along a direction away from the silicon nitride layer, and the lower refractive index constant layer is deposited on the lower refractive index decremental layer;

a step for forming a gate electrode insulation layer, comprising depositing a gate electrode insulation layer on the refractive index gradient layer;

a step for forming a first interlayer dielectric layer, comprising depositing a first interlayer dielectric layer on the gate electrode insulation layer, wherein: the first interlayer dielectric layer comprises a middle refractive index incremental layer, a middle refractive index constant layer, and a middle refractive index decremental layer; a refractive index of the middle refractive index incremental layer gradually increases along a direction away from the gate electrode insulation layer; the middle refractive index constant layer is formed on the middle refractive index incremental layer, and a refractive index of the middle refractive index constant layer is constant; and a refractive index of the middle refractive index decremental layer gradually decreases along a direction away from the middle refractive index constant layer; and a step for forming a second interlayer dielectric layer, comprising depositing a second interlayer dielectric layer on the first interlayer dielectric layer;

wherein the second interlayer dielectric layer comprises an upper refractive index decremental layer and an upper refractive index constant layer, a refractive index of the upper refractive index decremental layer gradually decreases along a direction away from the first interlayer dielectric layer, the upper refractive index constant layer is formed on the upper refractive index decremental layer, and a refractive index of the upper refractive index constant layer is constant;

wherein the silicon oxide of the refractive index gradient layer is made by a plasma-enhanced chemical vapor deposition process employing tetraethoxysilane (TEOS) and oxygen as reactants to perform a chemical reaction, the lower refractive index decremental layer is formed by continuously changing a ratio of the TEOS and the oxygen and a power of producing plasma in the plasma-enhanced chemical vapor deposition process to make film density of the silicon oxide from compactness to looseness gradually such that a high-to-low gradient region of the refractive index is formed by the lower refractive index decremental layer;

wherein the gate electrode insulation layer is made of silicon oxide, the first interlayer dielectric layer is made of silicon nitride, and the second interlayer dielectric layer is made of silicon oxide.

In an embodiment of the present invention, the silicon nitride of the first interlayer dielectric layer is made by a plasma-enhanced chemical vapor deposition process employing ammonia and silane as reactants to perform a chemical reaction, the middle refractive index incremental layer is formed by continuously changing a ratio of the ammonia and the silane and a power of producing plasma in the plasma-enhanced chemical vapor deposition process to make film density of the silicon nitride from looseness to compactness gradually, such that a low-to-high gradient region of the refractive index is formed by the middle refractive index incremental layer, and the middle refractive index decremental layer is formed by continuously changing a ratio of the ammonia and the silane and a power of producing plasma in the plasma-enhanced chemical vapor deposition process to make film density of the silicon nitride from compactness to looseness gradually such that a high-to-low gradient region of the refractive index is formed by the middle refractive index decremental layer.

In an embodiment of the present invention, the upper refractive index decremental layer of the second interlayer dielectric layer is formed by continuously changing a ratio of the TEOS and the oxygen and a power of producing plasma in the plasma-enhanced chemical vapor deposition process to make film density of the silicon oxide from compactness to looseness gradually such that a high-to-low gradient region of the refractive index is formed by the upper refractive index decremental layer.

In an embodiment of the present invention, the manufacturing method further comprises: a step for forming a planarization layer, comprising forming a planarization layer on the second interlayer dielectric layer; a step for forming a transparent electrode layer, comprising forming a transparent electrode layer on the planarization layer; and a step for forming a passivation layer, comprising forming a passivation layer on the transparent electrode layer.

In an embodiment of the present invention, the transparent electrode layer is made of indium tin oxide, and the passivation layer is made of silicon nitride.

Advantages

Compared to the prior art, the present invention, by using the lower refractive index decremental layer and the lower refractive index constant layer of the refractive index gradient layer 的, the middle refractive index incremental layer and the middle refractive index decremental layer of the first interlayer dielectric layer, and the upper refractive index decremental layer of the second interlayer dielectric layer, the refractive indexes between the film layers can be connected together progressively incremental or decremental ways. Therefore, the present invention can prevent the reflection rates on interfaces between the film layers from being excessively great to lower the transmittance and further enhance the brightness of the display panel while lowering power consumption thereof.

In order to make the above contents of the present invention clearer and more understandable, detailed descriptions of preferred embodiments in conjunction with the drawings will be presented as follows.

DETAILED DESCRIPTION OF PREFERRED EMBODIMENTS

To solve the issue of a low transmittance resulting from high reflection rates between film layers of a conventional liquid crystal display, the present invention by changing compactness degree of the film layers on the interfaces to change the refractive index such that the interfaces are formed with gradient refractive indexes to reduce a reflection rate of the interface.

Figure 1:
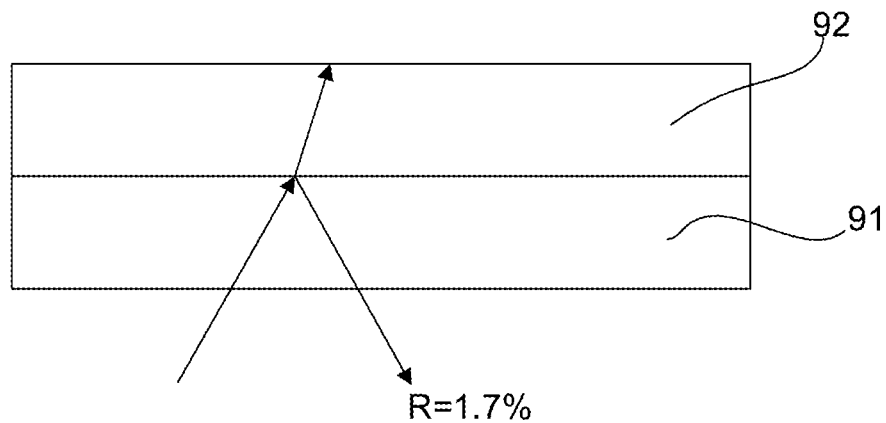
FIG. 1 is a schematic explanatory cross-sectional view of a silicon oxide (SiOx) layer and a silicon nitride (SiNx) layer showing refractive indexes thereof and a transmittance variation relation to which the present invention is based.

With reference to FIG. 1, FIG. 1 is a schematic explanatory cross-sectional view of a silicon oxide (SiOx) layer 91 and a silicon nitride (SiNx) layer 92 showing refractive indexes thereof and a transmittance variation relation to which the present invention is based. By calculation, it is acquired that an interface reflection rate of the silicon oxide (SiOx) layer 91 and the silicon nitride (SiNx) layer 92 is 1.7%. A total transmittance of the above silicon oxide (SiOx) layer 91 and silicon nitride (SiNx) layer 92 is 98.3%.

Figure 2:
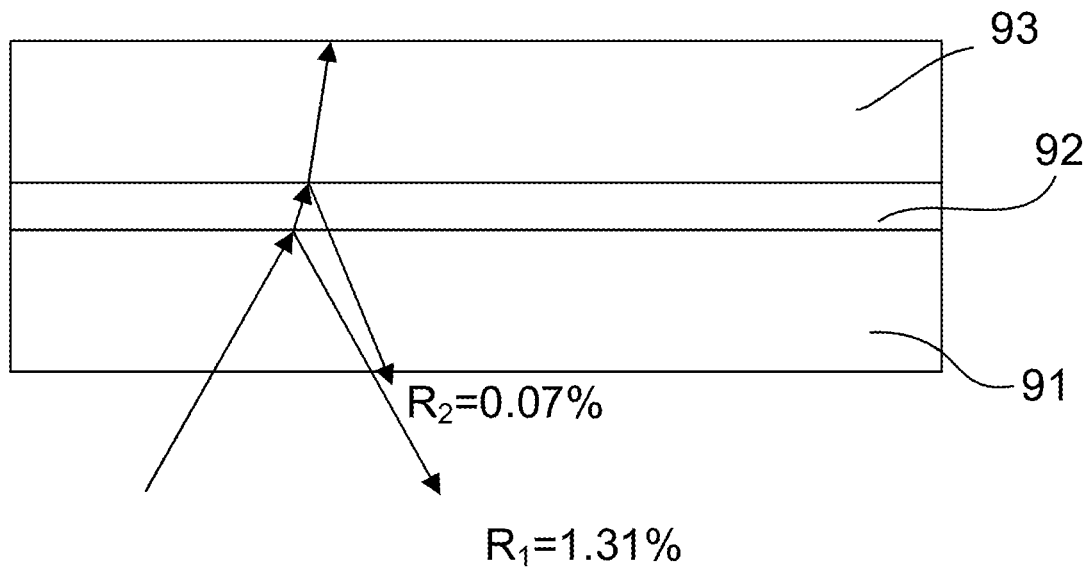
FIG. 2 is another schematic explanatory cross-sectional view of a silicon oxide (SiOx) layer and a silicon nitride (SiNx) layer showing refractive indexes thereof and a transmittance variation relation to which the present invention is based.

With reference to FIG. 2, FIG. 2 is another schematic explanatory cross-sectional view of a silicon oxide (SiOx) layer 91 and a silicon nitride (SiNx) layer 92 showing refractive indexes thereof and a transmittance variation relation to which the present invention is based. The silicon nitride (SiNx) layer 92 and the second silicon nitride (SiNx) layer 93 are sequentially stacked on the silicon oxide (SiOx) layer 91. A refractive index of the silicon nitride (SiNx) layer 92 is 1.85. The above structure forms a first interface between the silicon oxide (SiOx) layer and the silicon nitride (SiNx) layer 92 (refractive index n=1.85) and a second interface between the silicon nitride (SiNx) layer 92 (refractive index n=1.85) and the second silicon nitride (SiNx) layer 93 (refractive index n=1.92). By calculation, reflection rates of the first and second interface are 1.31% and 0.07% respectively, and a sum of the reflection rates are 1.38%, which is 0.32% lower than a single interface. A total transmittance of the silicon oxide (SiOx) layer 91, the silicon nitride (SiNx) layer 92, and the second silicon nitride (SiNx) layer 93 is 98.62%, which is improved compared to the transmittance of the structure in FIG. 1.

As described above, the present invention can dispose layers of refractive index gradient interfaces to further lower the reflection rate. Furthermore, a multi-film layer structure, when a thickness of a film layer fulfils an equation of nd=mλ/4 (m is an integer), reflected light on an interface of the film layer will suffer destructive interference or enhanced interference. Therefore, adjusting a thickness of each film layer into a specific value can further improve the transmittance of the multi-film layer.

Figure 3:
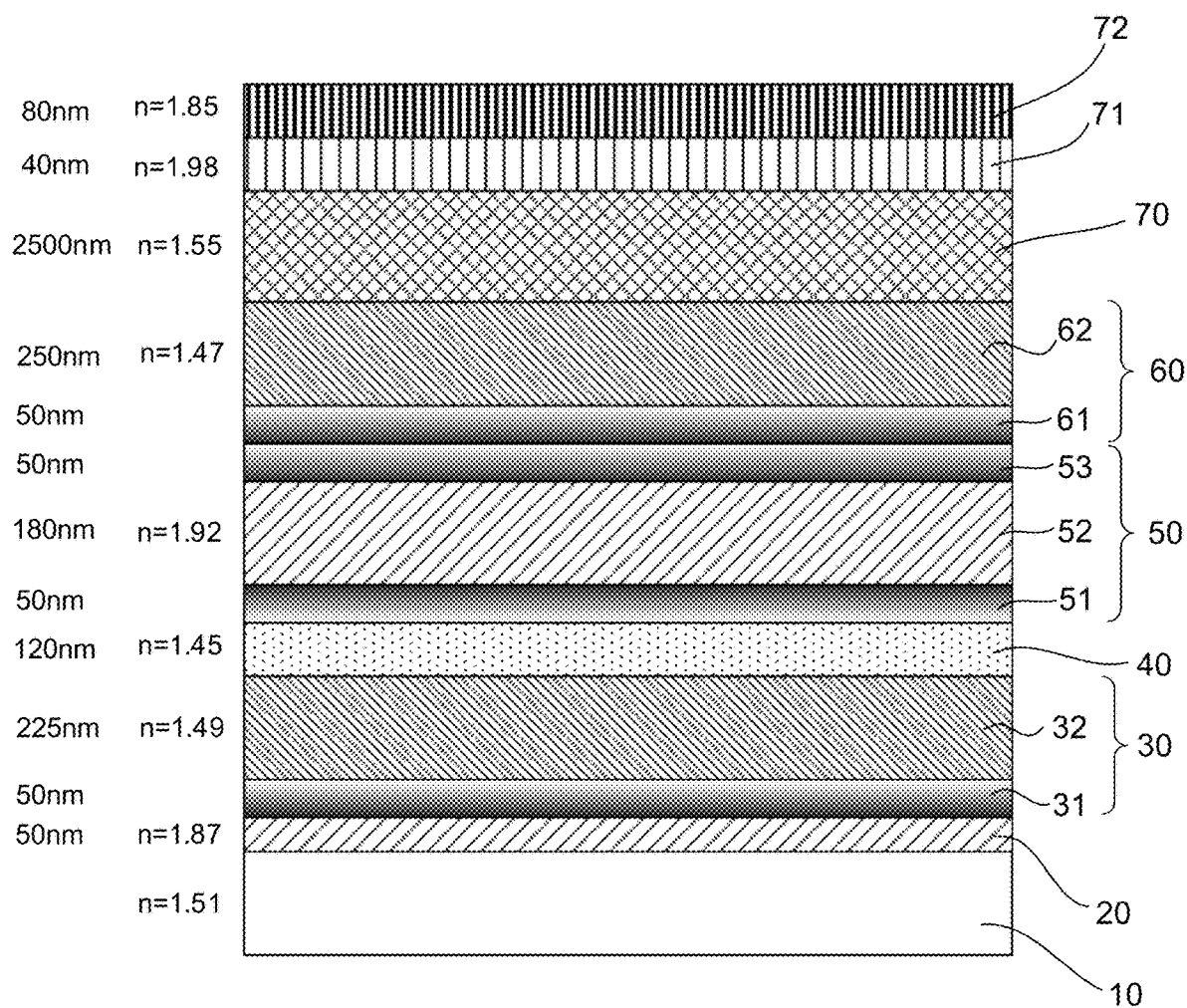
FIG. 3 is a schematic cross-sectional side view of a high transmittant liquid crystal display panel of the present invention.
Figure 4:
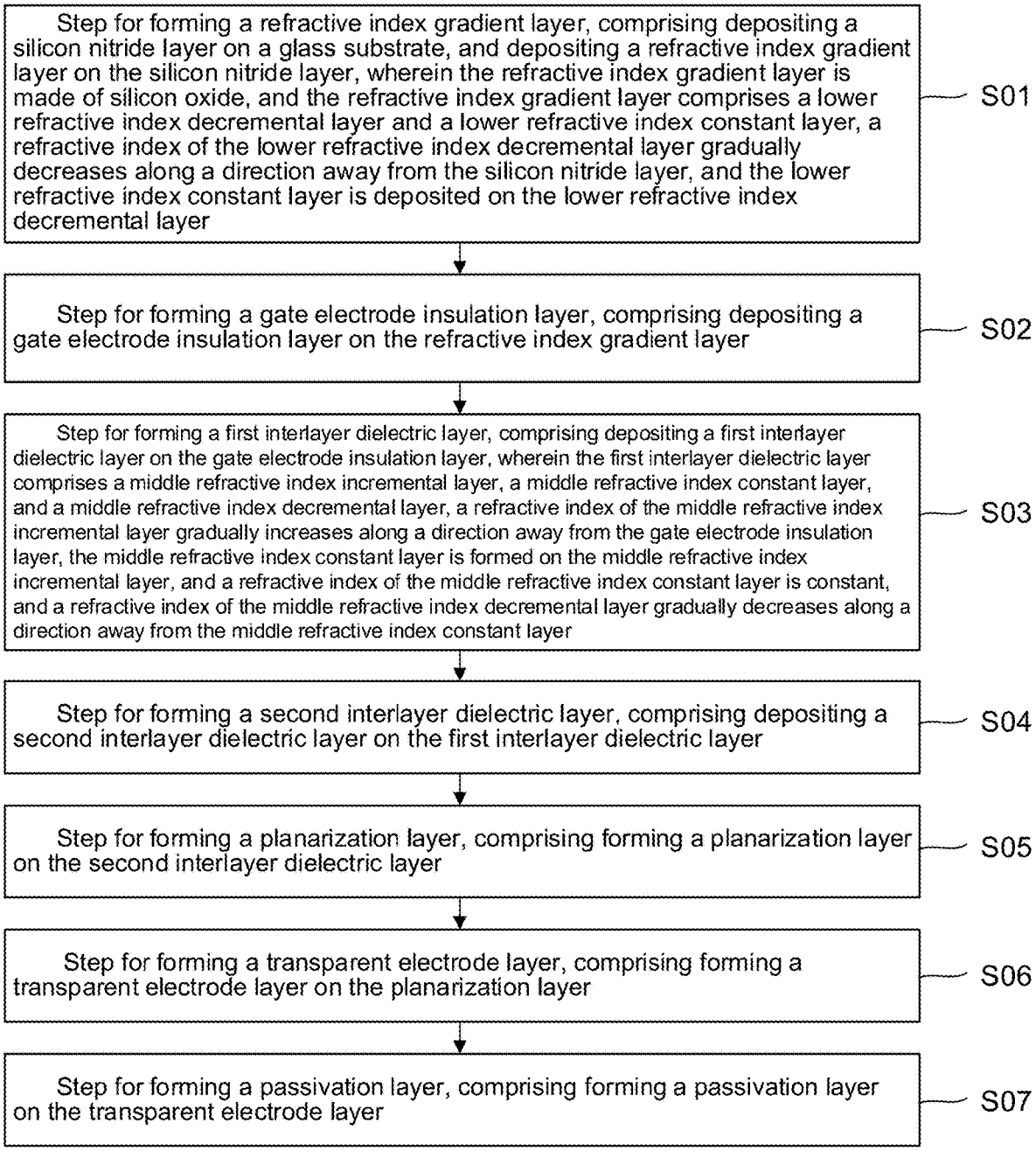
FIG. 4 is a schematic flowchart of a manufacturing method for a liquid crystal display panel with high transmittance of the present invention.

With reference to FIGS. 3 and 4, FIG. 3 is a schematic cross-sectional side view of a high transmittant liquid crystal display panel of the present invention, and FIG. 4 is a schematic flowchart of a manufacturing method for a liquid crystal display panel with high transmittance of the present invention. The present invention, based on a principle of the refractive index and the transmittance variation relation, provides a manufacturing method for a liquid crystal display panel with high transmittance. The manufacturing method for a liquid crystal display panel with high transmittance includes a step for forming a refractive index gradient layer S01, a step for forming a gate electrode insulation layer S02, a step for forming a first interlayer dielectric layer S03, a step for forming a second interlayer dielectric layer S04, a step for forming a planarization layer S05, a step for forming a transparent electrode layer S06, and a step for forming a passivation layer S07.

The step for forming a refractive index gradient layer S01 includes depositing a silicon nitride (SiNx) layer 20 on a glass substrate 10. A thickness of the silicon nitride (SiNx) layer 20 can be 50 nm. Then, a refractive index gradient layer 30 is deposited on the silicon nitride (SiNx) layer 20. The refractive index gradient layer 30 is made of silicon oxide (SiOx), and the refractive index gradient layer 30 includes a lower refractive index decremental layer 31 and a lower refractive index constant layer 32. A refractive index of the lower refractive index decremental layer 31 gradually decreases along a direction away from the silicon nitride (SiNx) layer 20. The lower refractive index constant layer 32 is deposited on the lower refractive index decremental layer 31.

In a preferred embodiment of the present invention, the refractive index gradient layer 30 is deposited by a plasma-enhanced chemical vapor deposition (PECVD) process. Specifically, the silicon oxide (SiOx) of the refractive index gradient layer 30 is made by the PECVD process employing tetraethoxysilane (TEOS, $Si(OC_2H_5)_4$) and oxygen ($O_2$) as reactants to perform a chemical reaction. A reaction equation generating the silicon oxide (SiOx) is TEOS+$O_2$→SiOx. By adjusting a ratio of the TEOS and the $O_2$, the more a ratio of TEOS is greater, the higher the refractive index is. The lower refractive index decremental layer 31 is formed by continuously changing a ratio of the TEOS and the $O_2$ and a power of producing plasma in the PECVD process to make film density of the silicon oxide (SiOx) from compactness to looseness gradually such that a high-to-low gradient region of the refractive index is formed by the lower refractive index decremental layer 31. A thickness of the lower refractive index decremental layer 31 is 50 nm. Then, the silicon oxide (SiOx) layer is deposited by normal parameters and has a thickness of 225 nm.

The step for forming a gate electrode insulation layer S02 includes depositing a gate electrode insulation layer 40 on the refractive index gradient layer 30. Because a difference of refractive indexes of the gate electrode insulation layer 40 and the refractive index gradient layer 30 are less, a thickness of the gate electrode insulation layer 40 is only required to be 120 nm to make a sum of the thicknesses of the gate electrode insulation layer 40 and the refractive index gradient layer 30 fulfill a condition for destructive interference. In a preferred embodiment of the present invention, the gate electrode insulation layer 40 is made of silicon oxide (SiOx), in other words, the gate electrode insulation layer 40 is a silicon oxide (SiOx) layer.

The step for forming a first interlayer dielectric layer S03 includes depositing a first interlayer dielectric layer 50 on the gate electrode insulation layer 40. The first interlayer dielectric layer 50 includes a middle refractive index incremental layer 51, a middle refractive index constant layer 52, and a middle refractive index decremental layer 53. A refractive index of the middle refractive index incremental layer 51 gradually increases along a direction away from the gate electrode insulation layer 40. The middle refractive index constant layer 5 is formed on the middle refractive index incremental layer 51, and a refractive index of the middle refractive index constant layer 52 is constant. A refractive index of the middle refractive index decremental layer 53 gradually decreases along a direction away from the middle refractive index constant layer.

In a preferred embodiment of the present invention, the first interlayer dielectric layer 50 is made of silicon nitride (SiNx).

In a preferred embodiment of the present invention, the first interlayer dielectric layer 50 is deposited by a PECVD process. Specifically, the silicon nitride (SiNx) of the first interlayer dielectric layer 50 is made by the PECVD process employing ammonia ($NH_3$) and silane ($SiH_4$) as reactants to perform a chemical reaction. A reaction equation for generating the silicon nitride (SiNx) is $SiH_4+NH_3+N_2$→SiNx. The higher a ratio of $SiH_4$ is, the greater a refractive index of the generated film layer is.

In a preferred embodiment of the present invention, the middle refractive index incremental layer 51 is formed by continuously changing a ratio of the ammonia ($NH_3$) and the silane ($SiH_4$) and a power of producing plasma in the PECVD process to make film density of the silicon nitride (SiNx) from looseness to compactness gradually, such that a low-to-high gradient region of the refractive index is formed by the middle refractive index incremental layer 51. A thickness of the middle refractive index incremental layer 51 is 50 nm. Then, the middle refractive index constant layer 52 is formed by depositing silicon nitride (SiNx) with normal parameters, and a thickness of the middle refractive index constant layer 52 is 180 nm. Finally, the middle refractive index decremental layer 53 is formed by continuously changing a ratio of the ammonia ($NH_3$) and the silane ($SiH_4$) and a power of producing plasma in the PECVD process to make film density of the silicon nitride (SiNx) from compactness to looseness gradually, such that a high-to-low gradient region of the refractive index is formed by the middle refractive index decremental layer 53. A thickness of the middle refractive index decremental layer 53 is 50 nm. A total thickness of the silicon nitride (SiNx) of the step for forming the first interlayer dielectric layer S03 is 280 nm, which fulfils the condition for destructive interference.

the step for forming a second interlayer dielectric layer S04 includes depositing a second interlayer dielectric layer 60 on the first interlayer dielectric layer 50. The second interlayer dielectric layer 60 includes an upper refractive index decremental layer 61 and an upper refractive index constant layer 62. A refractive index of the upper refractive index decremental layer 61 gradually decreases along a direction away from the first interlayer dielectric layer 50. The upper refractive index constant layer 62 is formed on the upper refractive index decremental layer 61. A refractive index of the upper refractive index constant layer 62 is constant.

In a preferred embodiment of the present invention, the second interlayer dielectric layer 60 is made of silicon oxide (SiOx).

In a preferred embodiment of the present invention, the second interlayer dielectric layer 60 the upper refractive index decremental layer 61 is formed by continuously changing a ratio of the TEOS and the $O_2$ and a power of producing plasma in the PECVD process to make film density of the silicon oxide (SiOx) from compactness to looseness gradually, such that a high-to-low gradient region of the refractive index is formed by the upper refractive index decremental layer 61. A thickness of the upper refractive index decremental layer 61 is 50 nm. The upper refractive index constant layer 62 is formed by depositing a silicon oxide (SiOx) layer with normal parameters, and a thickness of the upper refractive index constant layer 62 is 250 nm.

the step for forming a planarization layer S05 includes forming a planarization layer 70 on the second interlayer dielectric layer 60. In a preferred embodiment of the present invention, a thickness of the planarization layer 70 is 2500 nm.

the step for forming a transparent electrode layer S06 includes forming a transparent electrode layer 71 on the planarization layer 70. In a preferred embodiment of the present invention, the transparent electrode layer 71 is made of indium tin oxide (ITO). In a preferred embodiment of the present invention, a thickness of the transparent electrode layer 71 is 40 nm.

the step for forming a passivation layer S07 includes forming a passivation layer 72 on the transparent electrode layer 71. In a preferred embodiment of the present invention, the passivation layer 72 can be made of silicon nitride (SiNx). In a preferred embodiment of the present invention, a thickness of the passivation layer 72 is 80 nm.

The above thicknesses of the planarization layer 70, the transparent electrode layer 71, and the passivation layer 72 fulfil the condition for destructive interference.

With reference to FIG. 3, the present invention also provides a high transmittant liquid crystal display panel made by the manufacturing method for a liquid crystal display panel with high transmittance and including a glass substrate 10, a silicon nitride (SiNx) layer 20, a refractive index gradient layer 30, a gate electrode insulation layer 40, a first interlayer dielectric layer 50, a second interlayer dielectric layer 60, a planarization layer 70, a transparent electrode layer 71, and a passivation layer 72.

A refractive index n of the glass substrate 10 is 1.51.

The silicon nitride (SiNx) layer 20 is formed on the glass substrate 10. A refractive index n of the silicon nitride (SiNx) layer 20 is 1.87.

The refractive index gradient layer 30 is formed on the silicon nitride (SiNx) layer 20 and includes a lower refractive index decremental layer 31 and a lower refractive index constant layer 32. The lower refractive index decremental layer 31 is formed on the silicon nitride (SiNx) layer 20, and a refractive index of the lower refractive index decremental layer 31 gradually decreases along a direction away from the silicon nitride (SiNx) layer 20. The lower refractive index constant layer 32 is formed on the lower refractive index decremental layer 31. Furthermore, a refractive index n of the lower refractive index constant layer 32 is 1.49.

The gate electrode insulation layer 40 is formed on the refractive index gradient layer 30. In a preferred embodiment of the present invention, the gate electrode insulation layer 40 is made of silicon oxide (SiOx). A refractive index n of the gate electrode insulation layer 40 is 1.45.

The first interlayer dielectric layer 50 is formed on the gate electrode insulation layer 40. The first interlayer dielectric layer 50 includes a middle refractive index incremental layer 51, a middle refractive index constant layer 52, and a middle refractive index decremental layer 53. A refractive index of the middle refractive index incremental layer 51 gradually increases along a direction away from the gate electrode insulation layer 40. The middle refractive index constant layer 52 is formed on the middle refractive index incremental layer 51. A refractive index of the middle refractive index constant layer 52 is constant. The refractive index n is 1.92. A refractive index of the middle refractive index decremental layer 53 gradually decreases along a direction away from the middle refractive index constant layer. In a preferred embodiment of the present invention, the first interlayer dielectric layer 50 is made of silicon nitride (SiNx).

The second interlayer dielectric layer 60 is formed on the first interlayer dielectric layer 50. The second interlayer dielectric layer 60 includes an upper refractive index decremental layer 61 and an upper refractive index constant layer 62. A refractive index of the upper refractive index decremental layer 61 gradually decreases along a direction away from the first interlayer dielectric layer 50. The upper refractive index constant layer 62 is formed on the upper refractive index decremental layer 61. A refractive index of the upper refractive index constant layer 62 is constant. The refractive index n is 1.47.

The planarization layer 70 is formed on the second interlayer dielectric layer 60. The planarization layer 70 refractive index n is 1.55.

The transparent electrode layer 71 is formed on the planarization layer 70. A refractive index n of the transparent electrode layer 71 is 1.98.

The passivation layer 72 is formed on the transparent electrode layer 71. A refractive index n of the passivation layer 72 is 1.85.

Compared to the prior art, the present invention, by using the lower refractive index decremental layer 31 and the lower refractive index constant layer 32 of the refractive index gradient layer 30, the middle refractive index incremental layer 51 and the middle refractive index decremental layer 53 of the first interlayer dielectric layer 50, and the upper refractive index decremental layer 61 of the second interlayer dielectric layer 60, the refractive indexes between the film layers can be connected together progressively incremental or decremental ways. Therefore, the present invention can prevent the reflection rates on interfaces between the film layers from being excessively great to lower the transmittance and further enhance the brightness of the display panel while lowering power consumption thereof.

What is claimed is:

1. A manufacturing method for a liquid crystal display panel with high transmittance, comprising:
    a step for forming a refractive index gradient layer, comprising depositing a silicon nitride layer on a glass substrate, and depositing a refractive index gradient layer on the silicon nitride layer, wherein the refractive index gradient layer is made of silicon oxide, and the refractive index gradient layer comprises a lower refractive index decremental layer and a lower refractive index constant layer, a refractive index of the lower refractive index decremental layer gradually decreases along a direction away from the silicon nitride layer, and the lower refractive index constant layer is deposited on the lower refractive index decremental layer;
    a step for forming a gate electrode insulation layer, comprising depositing a gate electrode insulation layer on the refractive index gradient layer;
    a step for forming a first interlayer dielectric layer, comprising depositing a first interlayer dielectric layer on the gate electrode insulation layer, wherein the first interlayer dielectric layer comprises a middle refractive index incremental layer, a middle refractive index constant layer, and a middle refractive index decremental layer, a refractive index of the middle refractive index incremental layer gradually increases along a direction away from the gate electrode insulation layer, the middle refractive index constant layer is formed on the middle refractive index incremental layer, and a refractive index of the middle refractive index constant layer is constant, and a refractive index of the middle refractive index decremental layer gradually decreases along a direction away from the middle refractive index constant layer; and a step for forming a second interlayer dielectric layer, comprising depositing a second interlayer dielectric layer on the first interlayer dielectric layer.

2. The manufacturing method for the liquid crystal display panel with high transmittance as claimed in claim 1, wherein the second interlayer dielectric layer comprises an upper refractive index decremental layer and an upper refractive index constant layer, a refractive index of the upper refractive index decremental layer gradually decreases along a direction away from the first interlayer dielectric layer, the upper refractive index constant layer is formed on the upper refractive index decremental layer, and a refractive index of the upper refractive index constant layer is constant.

3. The manufacturing method for the liquid crystal display panel with high transmittance as claimed in claim 1, wherein the silicon oxide of the refractive index gradient layer is made by a plasma-enhanced chemical vapor deposition process employing tetraethoxysilane (TEOS) and oxygen as reactants to perform a chemical reaction, the lower refractive index decremental layer is formed by continuously changing a ratio of the TEOS and the oxygen and a power of producing plasma in the plasma-enhanced chemical vapor deposition process to make film density of the silicon oxide from compactness to looseness gradually such that a high-to-low gradient region of the refractive index is formed by the lower refractive index decremental layer.

4. The manufacturing method for the liquid crystal display panel with high transmittance as claimed in claim 1, wherein the gate electrode insulation layer is made of silicon oxide, the first interlayer dielectric layer is made of silicon nitride, and the second interlayer dielectric layer is made of silicon oxide.

5. The manufacturing method for the liquid crystal display panel with high transmittance as claimed in claim 4, wherein the silicon nitride of the first interlayer dielectric layer is made by a plasma-enhanced chemical vapor deposition process employing ammonia and silane as reactants to perform a chemical reaction, the middle refractive index incremental layer is formed by continuously changing a ratio of the ammonia and the silane and a power of producing plasma in the plasma-enhanced chemical vapor deposition process to make a film density of the silicon nitride from looseness to compactness gradually, such that a low-to-high gradient region of the refractive index is formed by the middle refractive index incremental layer, and the middle refractive index decremental layer is formed by continuously changing a ratio of the ammonia and the silane and a power of producing plasma in the plasma-enhanced chemical vapor deposition process to make film density of the silicon nitride from compactness to looseness gradually such that a high-to-low gradient region of the refractive index is formed by the middle refractive index decremental layer.

6. The manufacturing method for the liquid crystal display panel with high transmittance, as claimed in claim 2, wherein the upper refractive index decremental layer of the second interlayer dielectric layer is formed by continuously changing a ratio of the TEOS and the oxygen and a power of producing plasma in the plasma-enhanced chemical vapor deposition process to make film density of the silicon oxide from compactness to looseness gradually such that a high-to-low gradient region of the refractive index is formed by the upper refractive index decremental layer.

7. The manufacturing method for the liquid crystal display panel with high transmittance as claimed in claim 1, wherein the manufacturing method further comprises: a step for forming a planarization layer, comprising forming a planarization layer on the second interlayer dielectric layer; a step for forming a transparent electrode layer, comprising forming a transparent electrode layer on the planarization layer; and a step for forming a passivation layer, comprising forming a passivation layer on the transparent electrode layer.

8. The manufacturing method for the liquid crystal display panel with high transmittance as claimed in claim 1, wherein the transparent electrode layer is made of indium tin oxide, and the passivation layer is made of silicon nitride.

9. A high transmittant liquid crystal display panel, comprising:
a glass substrate;
a silicon nitride layer, formed on the glass substrate;
a refractive index gradient layer, formed on the silicon nitride layer, and comprising a lower refractive index decremental layer and a lower refractive index constant layer, wherein the lower refractive index decremental layer is formed on the silicon nitride layer, the refractive index of the lower refractive index decremental layer gradually decreases along a direction away from the silicon nitride layer, and the lower refractive index constant layer is formed on the lower refractive index decremental layer;
a gate electrode insulation layer, formed on the refractive index gradient layer;
a first interlayer dielectric layer, formed on the gate electrode insulation layer, and comprising a middle refractive index incremental layer, a middle refractive index constant layer and a middle refractive index decremental layer, a refractive index of the middle refractive index incremental layer gradually increases along a direction away from the gate electrode insulation layer, the middle refractive index constant layer is formed on the middle refractive index incremental layer, and a refractive index of the middle refractive index constant layer is constant, a refractive index of the middle refractive index decremental layer gradually decreases along a direction away from the middle refractive index constant layer; and
a second interlayer dielectric layer, formed on the first interlayer dielectric layer, and comprising an upper refractive index decremental layer and an upper refractive index constant layer, wherein a refractive index of the upper refractive index decremental layer gradually decreases along a direction away from the first interlayer dielectric layer, the upper refractive index constant layer is formed on the upper refractive index decremental layer, and a refractive index of the upper refractive index constant layer is constant.

10. The high transmittant liquid crystal display panel as claimed in claim 1, wherein the gate electrode insulation layer is a silicon oxide layer.

11. A manufacturing method for a liquid crystal display panel with high transmittance, comprising:
a step for forming a refractive index gradient layer, comprising depositing a silicon nitride layer on a glass substrate, and depositing a refractive index gradient layer on the silicon nitride layer, wherein the refractive index gradient layer is made of silicon oxide, and the refractive index gradient layer comprises a lower refractive index decremental layer and a lower refractive index constant layer, a refractive index of the lower refractive index decremental layer gradually decreases along a direction away from the silicon nitride layer, and the lower refractive index constant layer is deposited on the lower refractive index decremental layer;

a step for forming a gate electrode insulation layer, comprising depositing a gate electrode insulation layer on the refractive index gradient layer;

a step for forming a first interlayer dielectric layer, comprising depositing a first interlayer dielectric layer on the gate electrode insulation layer, wherein: the first interlayer dielectric layer comprises a middle refractive index incremental layer, a middle refractive index constant layer, and a middle refractive index decremental layer; a refractive index of the middle refractive index incremental layer gradually increases along a direction away from the gate electrode insulation layer; the middle refractive index constant layer is formed on the middle refractive index incremental layer, and a refractive index of the middle refractive index constant layer is constant; and a refractive index of the middle refractive index decremental layer gradually decreases along a direction away from the middle refractive index constant layer; and a step for forming a second interlayer dielectric layer, comprising depositing a second interlayer dielectric layer on the first interlayer dielectric layer;

wherein the second interlayer dielectric layer comprises an upper refractive index decremental layer and an upper refractive index constant layer, a refractive index of the upper refractive index decremental layer gradually decreases along a direction away from the first interlayer dielectric layer, the upper refractive index constant layer is formed on the upper refractive index decremental layer, and a refractive index of the upper refractive index constant layer is constant;

wherein the silicon oxide of the refractive index gradient layer is made by a plasma-enhanced chemical vapor deposition process employing tetraethoxysilane (TEOS) and oxygen as reactants to perform a chemical reaction, the lower refractive index decremental layer is formed by continuously changing a ratio of the TEOS and the oxygen and a power of producing plasma in the plasma-enhanced chemical vapor deposition process to make film density of the silicon oxide from compactness to looseness gradually such that a high-to-low gradient region of the refractive index is formed by the lower refractive index decremental layer;

wherein the gate electrode insulation layer is made of silicon oxide, the first interlayer dielectric layer is made of silicon nitride, and the second interlayer dielectric layer is made of silicon oxide.

12. The manufacturing method for the liquid crystal display panel with high transmittance as claimed in claim 11, wherein the silicon nitride of the first interlayer dielectric layer is made by a plasma-enhanced chemical vapor deposition process employing ammonia and silane as reactants to perform a chemical reaction, the middle refractive index incremental layer is formed by continuously changing a ratio of the ammonia and the silane and a power of producing plasma in the plasma-enhanced chemical vapor deposition process to make film density of the silicon nitride from looseness to compactness gradually, such that a low-to-high gradient region of the refractive index is formed by the middle refractive index incremental layer, and the middle refractive index decremental layer is formed by continuously changing a ratio of the ammonia and the silane and a power of producing plasma in the plasma-enhanced chemical vapor deposition process to make film density of the silicon nitride from compactness to looseness gradually such that a high-to-low gradient region of the refractive index is formed by the middle refractive index decremental layer.

13. The manufacturing method for the liquid crystal display panel with high transmittance as claimed in claim 11, wherein the upper refractive index decremental layer of the second interlayer dielectric layer is formed by continuously changing a ratio of the TEOS and the oxygen and a power of producing plasma in the plasma-enhanced chemical vapor deposition process to make film density of the silicon oxide from compactness to looseness gradually such that a high-to-low gradient region of the refractive index is formed by the upper refractive index decremental layer.

14. The manufacturing method for the liquid crystal display panel with high transmittance as claimed in claim 11, wherein the manufacturing method further comprises: a step for forming a planarization layer, comprising forming a planarization layer on the second interlayer dielectric layer; a step for forming a transparent electrode layer, comprising forming a transparent electrode layer on the planarization layer; and a step for forming a passivation layer, comprising forming a passivation layer on the transparent electrode layer.

15. The manufacturing method for the liquid crystal display panel with high transmittance as claimed in claim 11, wherein the transparent electrode layer is made of indium tin oxide, and the passivation layer is made of silicon nitride.

* * * * *